US007672140B2

(12) United States Patent
Lane

(10) Patent No.: US 7,672,140 B2
(45) Date of Patent: Mar. 2, 2010

(54) CIRCUIT BOARD CONFIGURATION

(75) Inventor: Bruce Lane, Tempe, AZ (US)

(73) Assignee: Tensolite LLC, St. Augustine, FL (US)

( * ) Notice: Subject to any disclaimer, the term of this patent is extended or adjusted under 35 U.S.C. 154(b) by 205 days.

(21) Appl. No.: 12/009,895

(22) Filed: Jan. 22, 2008

(65) Prior Publication Data

US 2009/0183905 A1 Jul. 23, 2009

(51) Int. Cl.
    *H05K 7/00* (2006.01)
(52) U.S. Cl. .............. 361/760; 361/761; 361/803; 361/807; 174/262; 439/82
(58) Field of Classification Search ......... 174/260–266, 174/250; 361/760, 761, 763, 803, 807, 809–811; 29/832, 842, 846, 852; 439/82, 83, 943
See application file for complete search history.

(56) References Cited

U.S. PATENT DOCUMENTS

| | | | |
|---|---|---|---|
| 5,333,095 A * | 7/1994 | Stevenson et al. ........... 361/302 |
| 5,747,877 A | 5/1998 | Wilson | |
| 5,834,839 A | 11/1998 | Mertol | |
| 6,074,567 A | 6/2000 | Kuraishi et al. | |
| 6,314,743 B1 | 11/2001 | Hutchison | |
| 6,531,328 B1 | 3/2003 | Chen | |
| 6,562,643 B2 | 5/2003 | Chen | |
| 6,621,012 B2 | 9/2003 | Crockett et al. | |
| 6,809,268 B2 * | 10/2004 | Hayashi et al. ............. 174/260 |
| 7,190,071 B2 | 3/2007 | Shin et al. | |
| 7,199,309 B2 | 4/2007 | Chamberlin et al. | |
| 7,240,425 B2 * | 7/2007 | Khilchenko et al. ........... 29/837 |
| 7,375,290 B1 * | 5/2008 | Kwark et al. ................ 174/262 |
| 2005/0139390 A1 | 6/2005 | Kim et al. | |
| 2006/0081396 A1 * | 4/2006 | Hsu ........................... 174/255 |
| 2008/0169124 A1 * | 7/2008 | Zhang ........................ 174/262 |
| 2008/0201945 A1 * | 8/2008 | Sugane ........................ 29/852 |

OTHER PUBLICATIONS

PCT International Search Report and Written Opinion mailed Dec. 5, 2008 in co-pending PCT application No. PCT/US08/11391.

* cited by examiner

*Primary Examiner*—Dean A. Reichard
*Assistant Examiner*—Hoa C Nguyen
(74) *Attorney, Agent, or Firm*—Cislo & Thomas LLP; Kelly W. Cunningham, Esq.

(57) ABSTRACT

A circuit board configuration and method of packaging electronic component embedded into the circuit board in a manner that supports the electronic component thermally, electrically, and mechanically thereof, comprising a circuit board having a first surface and a circuit trace on the first surface; a recess or slot formed on the first surface defined by at least one sidewall that is oblique to the first surface of the circuit board; two or more plated surfaces on the at least one oblique sidewall and electrically connected to the circuit trace; and an electronic component having two or more electrical contact surfaces mounted to the two or more plated surfaces such that the electronic component is physically mounted to the oblique sidewall and in electrical communication with the circuit trace. The circuit board configuration may further comprise an encapsulant at least one end of the electronic component and a conductive material between the oblique sidewall and the electronic component to seal the electronic component inside the slot.

21 Claims, 3 Drawing Sheets

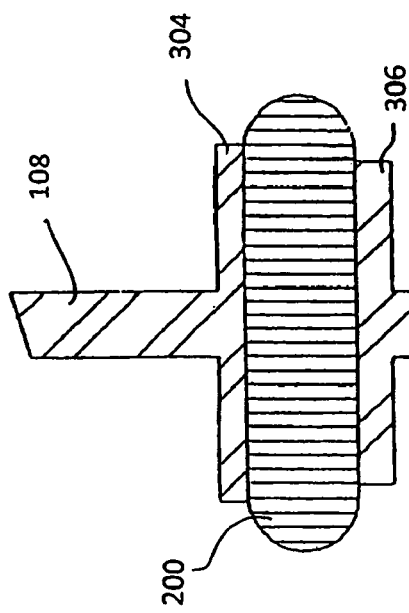
FIG. 5
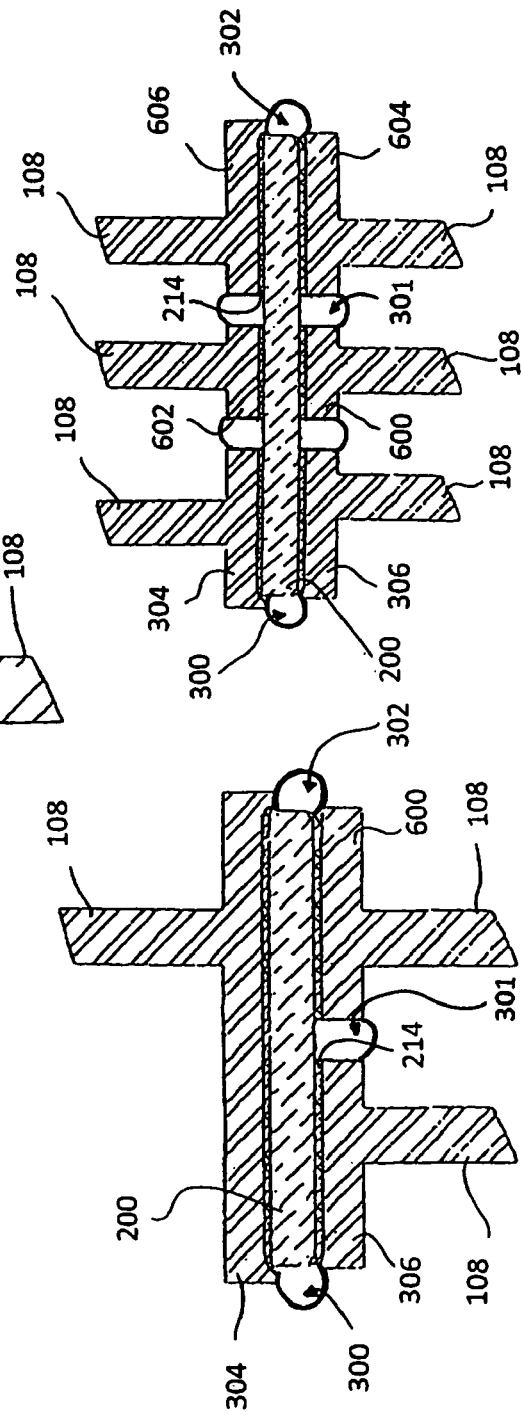
FIG. 6
FIG. 7

CIRCUIT BOARD CONFIGURATION

TECHNICAL FIELD

This invention relates to circuit board configurations and electronic component packaging.

BACKGROUND ART

The present invention relates to high density packaging of electronic circuit elements where electronic components are employed. It is usual practice for power electronic components to be packaged and then attached to a surface of a circuit board with or between circuit boards utilizing axial lead devices. These methods use considerable space and are both costly and heavy. Using the chip on board (COB) method which bonds an electronic component chip flat against the board then uses bond wires to make electrical connections is lighter and affords higher density and lower cost but has the drawback of limited current capability due to the bond wires. Other methods are also used to create higher densities while keeping the power handling capability at peak capacity. One is used in the EMI embodiment of attaching electronic components directly to contact pins, attaching a contact ring to the opposing side of the electronic component and over molding them with a plastic so they can then be inserted into an array of pins with a spring grounding feature contacting the contact rings. This approach has a major drawback in the cost and added weight associated with over molding each pin.

Packages in which multiple electronic components are packaged together are also used to reduce both cost and space. These packages limit the heat sinking capability for each electronic component to a division of the combined ability of the package, thus limiting the power handling capability of each electronic component unless the package is made sufficiently large, which would negate the space-saving capability.

Thus, there remains a need for an electronic circuit package that is durable, compact, light, and cost effective while maintaining high power handling and heat sinking capabilities.

DISCLOSURE OF INVENTION

An object of the present invention is to provide a novel electronic circuit packaging method or circuit board configuration that reduces space requirements and reduces costs associated with presently known packaging methods while maintaining or improving the current handling capabilities and heat sinking capabilities of known methods like those described above.

Another object is to provide an electronic component package which employs inexpensive components that can be assembled quickly and thus economically.

Another object is to provide an electronic component package which can be assembled with a high degree of reliability and can protect the electronic component against mechanical stresses, even when subjected to extreme temperature variations.

Another object is to provide an electronic component package which allows assembly into full systems using present technology, methods, and processes with a minimum of process change.

The above and other objectives are achieved, according to the present invention, by an electronic component packaging method comprising a circuit board configuration comprising of a circuit board having a first surface and a circuit trace on the first surface; a recess or slot formed on the first surface defined by at least one sidewall that is oblique to the first surface of the circuit board; two or more plated surfaces on the at least one oblique sidewall and electrically connected to the circuit trace; and an electronic component having two or more electrical contact surfaces mounted to the two or more plated surfaces such that the electronic component is physically mounted to the oblique sidewall and in electrical communication with the circuit trace.

BRIEF DESCRIPTION OF DRAWINGS

FIG. 5 is a top view of another embodiment of the current invention;

FIG. 6 is a top view of another embodiment of the current invention; and

FIG. 7 is a top view of another embodiment of the current invention.

MODES FOR CARRYING OUT THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

Figure 1:
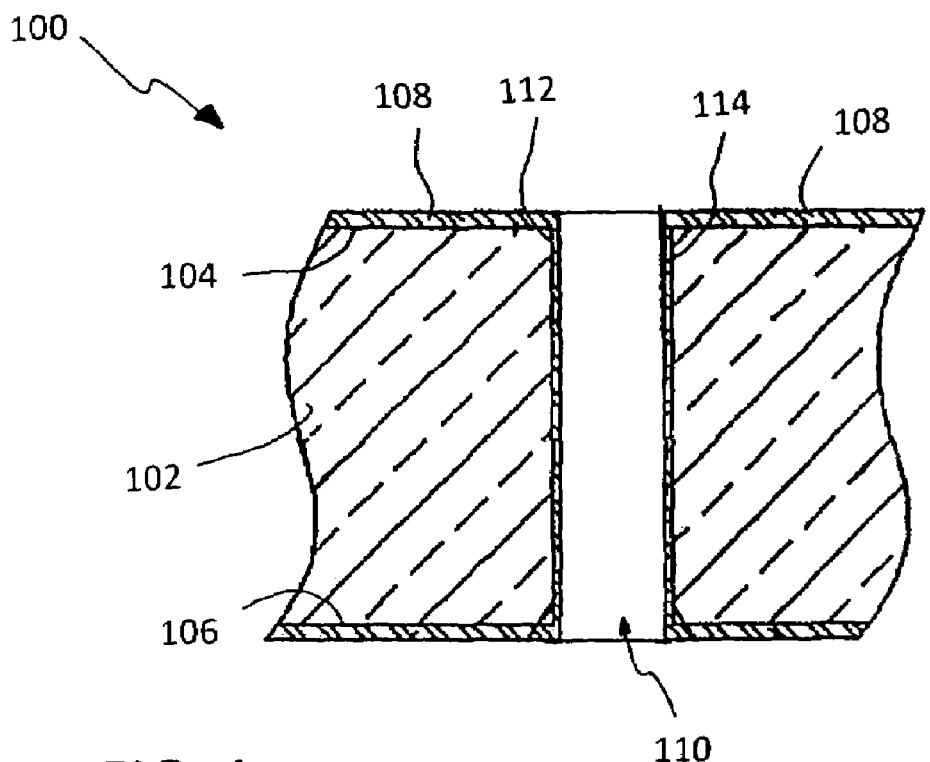
FIG. 1 is a cross-sectional side view of an embodiment of the current invention without the electronic component.

Referring to the embodiment of FIG. 1, the electronic component package or circuit board configuration 100 comprises a circuit board 102 having a first surface 104 and a second surface 106, wherein the first surface 104 and the second surface 106 define a thickness of the circuit board 102; a circuit trace 108 applied to at least the first surface 104; a plated recess or slot 110 through the first surface of the circuit board 102, wherein the recess or slot 110 is plated and thereby electrically contiguous with the circuit trace 108; and an electronic component 200 mounted inside the plated recess or slot 110.

The circuit trace 108 may link the electronic component 200 to other circuit elements. In some embodiments, the circuit trace 108 is on both the first surface 104 and the second surface 106 of the circuit board 102.

Figure 2:
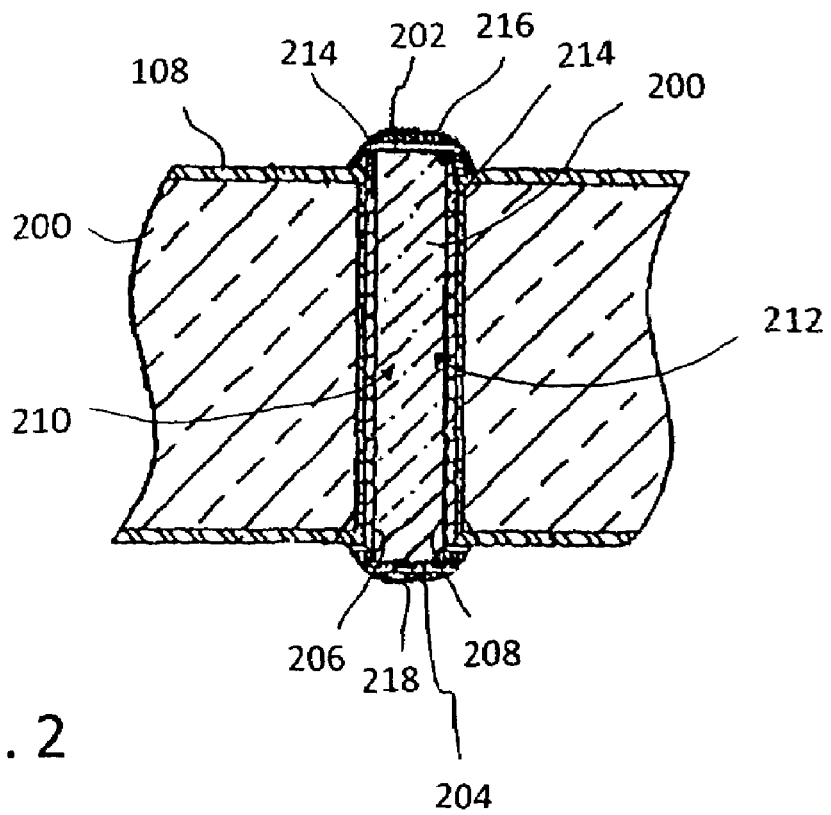
FIG. 2 is cross-sectional side view of an embodiment of the current invention with the electronic component.

The slot or recess 110 is formed on the first and/or second surface 104, 106 as an indentation, depression, orifice, hole or the like, defined by at least one sidewall 112 that is oblique to the first surface 104. In some embodiments, the slot or recess 110 is a through-hole extending from the first surface 104 of the circuit board 102 to the second surface 106 of the circuit board 102. Preferably, the dimensions of the slot or recess 110 are substantially similar to or slightly larger than the size of the electronic component 200. As shown in FIG. 2, the electronic component 200 has a first end 202 and a second end 204 defining a height therewith. In some embodiments, the height of the electronic component 200 is shorter that the thickness of the circuit board. This allows the electronic component 200 to be completely housed inside the slot or recess 110.

The slot or recess 110 may be any shape, for example, the slot or recess 110 may be rectangular or square having at least a first sidewall 112, and a second sidewall 114 opposite the first sidewall 112, defining a gap therebetween. Alternatively, the slot or recess 110 may be any other shape such as a cylinder, a cone, a wedge-shape, a rhombus, a triangle, etc. The slot or recess 110 is generally oblique to the first and second surfaces 104 and 106 of the circuit board 102. In other words, the angle created between at least one sidewall 112 of the slot 110 and the first and/or second surface 104, 106 of the circuit board 102 is greater than zero. To maximize space, the oblique angle of the slot or recess 110 should be approximately 90 degrees (i.e. generally or substantially perpendicular) to the first and/or the second surfaces 104, 106 of the circuit board 102. In some embodiments, the gap between the first sidewall 112 and the second sidewall 114 of the plated recess or slot 110 is less that the thickness of the circuit board 102. In other words, the electronic component 200 would be arranged vertically into the slot 110 to maximize space efficiency.

In some embodiments, the slot 110 may be a through-hole. In other embodiments, the slot 110 may be a recess or indentation only partially penetrating through the circuit board 102. In other words, the depth of the slot 110 may be less than the thickness of the circuit board 102.

Figure 3:
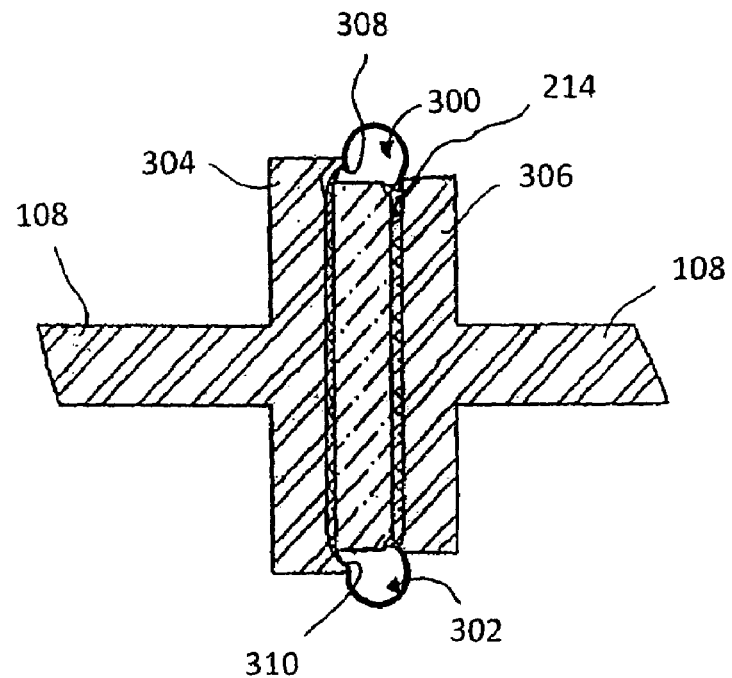
FIG. 3 is a top view of an embodiment of the current invention.
Figure 4:
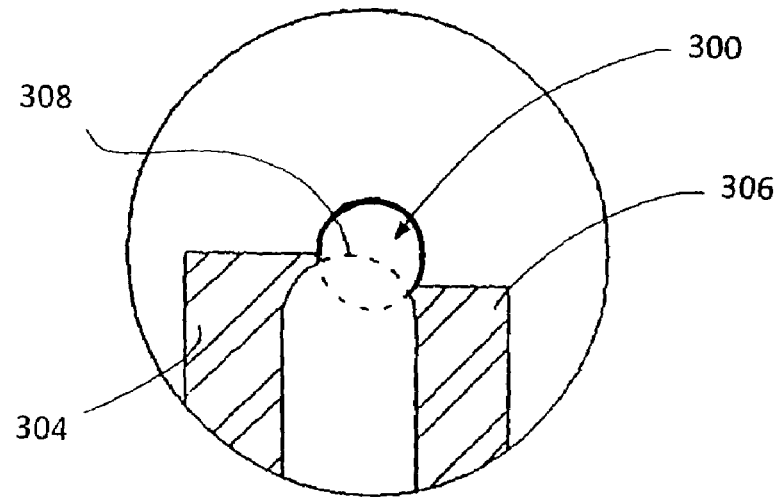
FIG. 4 is a close-up of a top view of the slot and plated surfaces of an embodiment of the current invention.

As shown in FIG. 3, one embodiment of the circuit board configuration 100 further comprises a first disruption 300 of a first portion of the plated slot 110 and a second disruption 302 of a second portion of the plated recess or slot 110. The disruptions 300 and 302 convert an electrically and physically contiguous plated slot 110 into at least two electrically and physically isolated plated portions or surfaces 304 and 306 of the slot such that the two plated surfaces 304 and 306 are electrically insulated from one another. For example, in rectangular or square-shaped slots having a first sidewall 112 opposite a second sidewall 114, the first and second disruptions 300, 302 may completely disrupt an electrical contiguity between the first sidewall 112 and the second sidewall 114 of the plated recess or slot 110. This may be accomplished by creating two disruptions of the plating along either the first sidewall 112 or the second sidewall 114, by creating a disruption at the two walls 308 and 310 adjacent to the first and second sidewalls 112 and 114, or any combination thereof.

In some embodiments, the slot 110 may not initially be plated. Rather, the slot 110 may be created after the initial plating of the circuit trace 108. Two or more plated surfaces 304, 306 may then be applied inside the slot 110 on at least one sidewall 112 and/or 114 and electrically connected to the circuit trace 108 but not electrically contiguous with one another.

To re-establish electrical contiguity between the separated plating an electronic component 200 having two or more electrical contact 206 and 208 surfaces may be inserted into the slots 110 and mounted to the two or more plated surfaces 304 and 306 with electrical contacts of the electronic component 200 in electrical communication with its respective plated surfaces 304 and 306 on at least one sidewall 112 and/or 114. The electronic component 200 may be physically mounted on one or more sidewalls 112, 114, wherein the two or more electrical contact surfaces 206 and 208 of the electronic component 200 directly contact the two or more plated surfaces 304 and 306 of at least one sidewall 112 and/or 114, thereby establishing direct electrical communication there between and obviating the need for any bond wires.

In some embodiments, the electronic component 200 has a first end 202, a second end 204 opposite the first end 202, and the electrical contact surfaces 206 and 208 may be at a cathode end 210, and an anode end 212 opposite the cathode 210. In some embodiments, for example, where the electronic component 200 is a diode, the cathode counterpart would be the n-type semiconductor and the anode counterpart would be the p-type semiconductor. The electronic component 200 may be insertable into the plated recess or slot 110 with the cathode end 210 adjacent to the first sidewall 112 of the plated recess or slot 110 and the anode end 212 adjacent to the second sidewall 114 of the plated recess or slot 110 or vice versa. With the first and second disruptions 300 and 302, the electrical continuity is re-established through the electronic component 200.

In some embodiments, the cathode end 210 of the electronic component 200 may directly contact the first plated surface 304, the first sidewall 112 of the plated recess or slot 110 and the anode end 212 of the electronic component 200 may directly contact the second plated surface 306 of the second sidewall 114 of the plated recess or slot 110, thereby establishing a direct electrical communication between the electronic component 200 and the plated recess or slot 110. Alternatively, the direct contact between the plated surfaces and the electrical contacts of the electrical component may occur on the same wall. A conductive material 214 may be introduced into the slot 110 at the anode end 212 and the cathode end 210 to seal the first and second plated surfaces 304 and 306 of the plated recess or slot 110 to the cathode end 210 and the anode end 212 of the electronic component 200, respectively. The conductive material 214 may be a solder, an adhesive, a spring element, or a eutectic alloy.

Because the electronic component 200 is captured in a slot 110, it is a simple matter to accurately position the connection portions of the electronic component 200 with the plated surfaces 304 and 306 of the slot 110 properly. The plated surfaces 304 and 306 are dimensioned to match the contact surfaces of the electronic component 200 surface, thereby maximizing the current carrying capability of the attachment, and making the complete current and heat path necessary to operate the electronic component at maximum capability. The space required in the slot 110 is minimized to a space slightly larger that the thickness of the electronic component 200 by a length slightly longer than the electronic component width, allowing for far greater densities than previous circuit board attachment methods. As a result the invention described herein combines a reduced number of elements from previous packages, thereby reducing costs, space, and weight.

As shown in FIG. 3, the circuit board configuration 100 may further comprise an encapsulant 216 to cover at least the first end 202 of the electronic component 200 to seal and secure the electronic component 200 inside the plated recess or slot 110. In embodiments in which the slot 110 is a through-hole, a second encapsulant 218 may be used to cover the second end 204 of the electronic component 200. The encapsulant 216 may be any dielectric material that can adhere to the circuit board 102 and electronic component 200 to make a tight seal.

The electronic component 200 may be a semiconductor, a transistor, a diode, a field effect transistor (e.g. MOSFET), operational amplifier, integrated circuit, or the like.

The circuit board configuration 110 of the current invention may be manufactured by providing a circuit board 102 having at least a first surface 104; forming a recess or slot 110 in the first surface 104 of the circuit board 102, wherein the recess or slot 110 is defined by at least a first sidewall 112 that is oriented oblique to the first surface 104 of the circuit board 102; applying a circuit trace 108 to at least the first surface 104 of the circuit board; plating at least the first sidewall 112 with an electrically conductive material to establish an electrical communication with the circuit trace 108 on the first surface 104 of the circuit board 102; disrupting the plating on the at least first sidewall 112 to form at least two plated surfaces 304 and 306 separated by a distance sufficient to electrically insulate the at least two plated surfaces 304 and 306 from one another; and mounting at least two electrical contact surfaces 206 and 208 of an electronic component 200 to the at least two plated surfaces 304 and 306 such that the electronic component 200 is physically supported by the oblique sidewall 112 and is in electrical communication with the circuit trace 108 on the circuit board 102.

The process of manufacturing the circuit board configuration 100 may further include sealing or securing the electrical connection or contiguity of the electronic component 200 inside the recess or slot 110 with a conductive material 214, thereby guaranteeing sound electrical communication between the electronic component 200 and the circuit trace 108. The conductive material 214 may be a solder, an adhesive, a spring element, or a eutectic alloy. For example, a soft solder that allows stress relief may be allowed to flow down between the opposed sidewalls 112 and 114 of the slot 110 and the opposed sides of the electronic component 200, creating an electrical, mechanical, and thermal attachment between the opposed sides of the plated slot 110 and the opposed sides of the electronic component 200.

In some embodiments, the slot or recess 110 is formed perpendicularly to the first surface 104 to maximize the efficient use of space. In other embodiments, the slot or recess 110 may be formed at any angle to the first surface 104. The slot or recess 110 may be formed by milling, drilling, or cutting into the circuit board 102.

In general, the circuit trace 108 is applied subsequent to the creation of the slot or recess 110. This allows the recess 110 to be plated at the same time the circuit trace 108 is created. In such embodiments, the entire slot 110 may be plated and the disruption step is required.

In some embodiments, the circuit trace 108 is applied prior to forming the recess or slot 110. In such embodiments, a separate plating step for the slot 110 is required after the slot 110 is formed. At least two electrically plated surfaces 304 and 306 separated by a distance sufficient to electrically insulate the electrically plated surfaces 304 and 306 from one another may be applied to at least one sidewall 112 of the slot or recess 110. Plating the sidewall 112 after applying the circuit trace may eliminate the disruption step since the plated surfaces 304 and 306 can be applied separated from one another.

In embodiments requiring a disruption step, the disruption of the plating in the slot 110 may be accomplished by drilling a bore, cutting, etching, abrading, burning, vaporizing, or otherwise removing the plating at one or more predetermined locations along the sidewall, thereby eliminating one or more portions of the plating thereon to create at least two separate plated portions 304 and 306. For example, as shown in FIG. 3, in embodiments with a rectangular electronic component 200 and a rectangular plated slot 110, two opposing sides 308 and 310 of the plated slot 110 are drilled from the first surface 104 of the circuit board 102 to the second surface 106 of the circuit board 102 to electrically separate a first plated sidewall 112 of the slot from a second plated sidewall 114 of the slot from each other creating a pair of opposed conductive surfaces of a size equivalent to that of the anode 212 and cathode 210 surfaces of the electronic component 200. This drilling is done with a sufficiently smaller drill than the slot 110 so as not to prevent the slot 110 from capturing the electronic component 200.

Further steps in the manufacture of the circuit board configuration 100 include encapsulating the electronic component 200 inside the slot or recess 110 to electrically and physically insulate the electronic component 200 from the environment. The encapsulant 216 may be a pliable thermally conductive dielectric material used to cover both the first end 202 and the second end 204 of the electronic component 200 inside the slot 110 to protect and help support the electronic component 200 as well as providing a heat sink to help dissipate any heat generated during use and improving the mechanical and thermal support. The encapsulant 216, plating 304 and 306, solder or conductive material 214, and circuit board material 102 together give the mass necessary to thermally sink away the heat generated within the electrical component 200 during normal operation.

In some embodiments, as shown in FIG. 5-7, the slot may comprise a plurality of plated surfaces 304, 304, 306, 600, 602, 604, and 606 electrically isolated from each other but in electrical communication with its respective circuit trace 108. Such applications may be suitable for use with transistors and other electronic components requiring a more than two or even a plurality of electrical contacts, such as various operational amplifier, integrated circuit, and the like. The entire slot 110 may be initially plated, such as during the application of the circuit trace 108. Then the first and second disruptions 300 and 302, as well as additional disruptions 301, in the plating may be created to form the plurality of plated surfaces 304, 304, 306, 600, 602, 604, and 606 that are isolated from each other but in electrical communication with a circuit trace 108. Alternatively, the slot 110 may be created after applying the circuit trace 108. In such embodiments, the slot 110 may be plated in discrete locations to create the plurality of plated surfaces 304, 304, 306, 600, 602, 604, and 606 that are separated from each other by disruptions 300, 301, and/or 302 but are electrically connected to a circuit trace 108.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims and the equivalents to the claims appended hereto.

INDUSTRIAL APPLICABILITY

This invention may be industrially applied to the development, manufacture, and use of electronic component packages or circuit board configurations without the use of bond wires. Such a circuit board configuration comprises a circuit board with a circuit trace and a plated slot electronically connected to the circuit trace. Disruptions are created in the plating of the slot to create at least two plated surfaces separate from each other but continuous within a circuit trace. Electrical continuity is re-established by inserting an electronic component with two or more electrical surfaces such that the electrical surfaces are mounted to the two or more plated surfaces within the slot.

What is claimed:
1. A circuit board configuration, comprising:
   a. a circuit board having a first surface and a second surface, wherein the first surface and the second surface define a thickness of the circuit board;
   b. a circuit trace applied to at least the first surface;

c. a plated recess or slot through the circuit board, the plated recess or slot having a first sidewall and a second sidewall opposite and generally parallel to the first sidewall, defining a gap therebetween, wherein the plated recess or slot is electrically contiguous with the circuit trace;

d. a first disruption of a first portion of the plated recess or slot;

e. a second disruption of a second portion of the plated recess or slot, wherein the first and second disruptions completely disrupt an electrical contiguity between the first sidewall and the second sidewall of the plated recess or slot; and f. an electronic component having a first end, a second end opposite the first end, a cathode end, and an anode end opposite the cathode end, wherein the electronic component is physically mounted to and physically protected by the first and second sidewalls within the plated recess or slot wit the cathode end adjacent to the first sidewall of the plated recess or slot and the anode end adjacent to the second sidewall of the plated recess or slot.

2. The circuit board configuration of claim 1, wherein the cathode end of the electronic component directly contacts the first sidewall of the plated recess or slot and wherein the anode end of the electronic component directly contacts the second sidewall of the plated recess or slot, thereby establishing a direct electrical communication between the electronic component and the plated recess or slot and obviating the need for bond wires.

3. The circuit board configuration of claim 1, further comprising an encapsulant covering at least the first end of the electronic component to seal and secure the electronic component inside the plated recess or slot.

4. The circuit board configuration of claim 1, wherein the gap between the first sidewall and the second sidewall of the plated recess or slot is less that the thickness of the circuit board.

5. The circuit board configuration of claim 1, further comprising a conductive material sealing the first and second sidewalls of the plated recess or slot to the cathode end and the anode end of the electronic component, respectively.

6. The circuit board configuration of claim 5, wherein the conductive material is selected from the group consisting of a solder, an adhesive, a spring element, and a eutectic alloy.

7. The circuit board configuration of claim 1, wherein the electronic component is a diode.

8. A circuit board configuration, comprising:
a. a circuit board having a first surface and a circuit trace on the first surface;
b. a recess or slot formed on the first surface defined by at least two sidewalls that are oblique to the first surface of the circuit board;
c. two or more plated surfaces on the at least two oblique sidewalls and electrically connected to the circuit trace; and
d. an electronic component having two or more electrical contact surfaces physically mounted to the two or more plated surfaces such that the electronic component is physically mounted to the at least two oblique sidewalls and in direct electrical communication with the circuit trace obviating the need for any bond wires.

9. The circuit board configuration of claim 8, further comprising an encapsulant that covers one or more exposed ends of the electronic component.

10. The circuit board configuration of claim 8, wherein the at least one oblique sidewall is generally perpendicular to the first surface of the circuit board.

11. The circuit board configuration of claim 8, further comprising a conductive material to secure the electronic component inside the recess or slot.

12. The circuit board configuration of claim 11, wherein the conductive material is selected from the group consisting of a solder, an adhesive, a spring element, and a eutectic alloy.

13. The circuit board configuration of claim 8, comprising two or more plated surfaces on two oblique sidewalls, wherein the two oblique sidewalls define a gap.

14. The circuit board configuration of claim 13, wherein the first surface of the circuit board and a second surface of the circuit board opposite the first surface defines a thickness of the circuit board and wherein the gap between the two oblique sidewalls is less than the thickness of the circuit board.

15. The circuit board configuration of claim 8, wherein the electronic component is selected from the group consisting of a diode, a transistor, a field effect transistor and an operational amplifier.

16. A method of packaging an electronic component in a circuit board, comprising:
a. providing a circuit board having at least a first surface;
b. forming a recess or slot in the first surface of the circuit board, said recess or slot being defined by at least a first and a second sidewall that are oriented oblique to the first surface of the circuit board and generally parallel to each other;
c. applying a circuit trace to at least the first surface of the circuit board;
d. plating the at least first and second sidewalls to establish an electrical communication with the circuit trace on the at least first surface of the circuit board;
e. disrupting the plating on the at least first and second sidewalls to form at least two plated surfaces separated by a distance sufficient to electrically insulate the at least two plated surfaces from one another; and
f. physically mounting at least two electrical contact surfaces of an electronic component to the at least two plated surfaces without using any bond wires
wherein the electronic component is physically supported and physically protected by the oblique sidewalls and is in direct electrical communication with the circuit trace on the circuit board.

17. The method of claim 16, wherein the circuit trace is applied prior to forming the recess or slot.

18. The method of claim 16, further comprising encapsulating the electronic component for electrically and physically insulating the electronic component from the environment.

19. The method of claim 16, wherein disrupting the plating on the at least first sidewall is achieved by a process selected from the group consisting of drilling a bore, cutting, etching, abrading, burning, vaporizing, and removing at one or more predetermined locations along the at least first and second sidewalls thereby removing one or more portions of the plating thereon between the at least two plated surfaces.

20. The method of claim 16, further comprising the step of securing the electrical communication inside the recess or slot with a conductive material.

21. The method of claim 16, wherein the recess or slot is formed generally perpendicularly to the first surface of the circuit board.

* * * * *